(12) United States Patent
Andrews et al.

(10) Patent No.: US 8,410,371 B2
(45) Date of Patent: Apr. 2, 2013

(54) ELECTRONIC DEVICE SUBMOUNTS WITH THERMALLY CONDUCTIVE VIAS AND LIGHT EMITTING DEVICES INCLUDING THE SAME

(75) Inventors: Peter S. Andrews, Durham, NC (US); Theodore D. Lowes, Lompoc, CA (US); Robert D. Underwood, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 546 days.

(21) Appl. No.: 12/555,218

(22) Filed: Sep. 8, 2009

(65) Prior Publication Data
US 2011/0056734 A1  Mar. 10, 2011

(51) Int. Cl.
H05K 7/20 (2006.01)
H05K 1/16 (2006.01)

(52) U.S. Cl. ........ 174/252; 174/260; 361/704; 361/719; 361/720

(58) Field of Classification Search .................. None
See application file for complete search history.

(56) References Cited

U.S. PATENT DOCUMENTS

| | | | |
|---|---|---|---|
| 3,948,706 A | 4/1976 | Schmeckenbecher | |
| 4,302,625 A | 11/1981 | Hetherington et al. | |
| 4,539,058 A | 9/1985 | Burgess et al. | |
| 4,729,061 A * | 3/1988 | Brown | 361/719 |
| 4,731,701 A * | 3/1988 | Kuo et al. | 361/712 |
| 5,113,315 A | 5/1992 | Capp et al. | |
| 6,115,255 A | 9/2000 | Iovdalsky | |
| 6,265,767 B1 | 7/2001 | Gaku et al. | |
| 6,706,972 B1 * | 3/2004 | Martin | 174/260 |
| 6,930,885 B2 * | 8/2005 | Barcley | 361/719 |
| 7,495,322 B2 * | 2/2009 | Hashimoto et al. | 257/676 |
| 7,872,841 B2 * | 1/2011 | Leduc et al. | 361/56 |
| 2003/0214049 A1 | 11/2003 | Hortzleza et al. | |
| 2004/0079957 A1 | 4/2004 | Andrews et al. | |
| 2004/0126913 A1 | 7/2004 | Loh | |
| 2005/0146854 A1 | 7/2005 | Ikuta et al. | |
| 2005/0269587 A1 | 12/2005 | Loh et al. | |
| 2006/0097382 A1 | 5/2006 | Mori et al. | |
| 2007/0253209 A1 | 11/2007 | Loh et al. | |
| 2009/0085180 A1 | 4/2009 | Kan et al. | |
| 2009/0154513 A1 | 6/2009 | Shin | |

OTHER PUBLICATIONS

International Preliminary Report on Patentability Corresponding to International Application No. PCT/US2010/045713; Date of Mailing: Mar. 22, 2012; 10 pages.
International Search Report and Written Opinion of the International Searching Authority for International Application No. PCT/US2010/045713; Date of Mailing: May 13, 2011; 14 pp.

* cited by examiner

*Primary Examiner* — Gregory Thompson
(74) *Attorney, Agent, or Firm* — Myers Bigel Sibley & Sajovec

(57) ABSTRACT

A submount for an electronic device includes an electrically insulating substrate including first and second surfaces and having a thickness between the first and second surfaces, a thermally conductive pad on the first surface of the substrate, and a thermally conductive via extending from the first surface of the substrate toward the second surface of the substrate and having a length that is less than the thickness of the substrate. The thermally conductive via has a higher thermal conductivity than a thermal conductivity of the substrate. Methods of forming submounts are also disclosed.

14 Claims, 12 Drawing Sheets

ELECTRONIC DEVICE SUBMOUNTS WITH THERMALLY CONDUCTIVE VIAS AND LIGHT EMITTING DEVICES INCLUDING THE SAME

FIELD OF THE INVENTION

This invention relates to electronic device packaging, and more particularly to submounts for electronic devices such as semiconductor light emitting devices.

BACKGROUND

Solid state electronic devices can be mounted on submounts that provide mechanical support, electrical connection, and thermal dissipation, as well as other functionality, for the electronic devices. For example, solid state light sources, such as semiconductor light emitting diodes, can be mounted on submounts as disclosed in U.S. Pre-grant Publication No. 2007/0253209 which is assigned to the assignee of the present invention and which is incorporated herein by reference as if fully set forth herein. The submounts may further be provided in packages that provide protection, color selection, focusing and the like for light emitted by the light emitting device. A solid state light emitting device may be, for example, an organic or inorganic light emitting diode ("LED"). Some packages for light emitting diodes are described in U.S. Pre-grant Publication Nos. 2004/0079957, 2004/0126913, and 2005/0269587 which are assigned to the assignee of the present invention, and which are incorporated herein by reference as if set forth fully herein.

Alumina-based submounts for electronic devices can be formed using green state alumina sheets. Green state alumina tape, which is malleable, can be press-molded into various shapes and can be punched, cut or drilled to form vias or other features therein. For example, referring to FIG. 1, a submount 5 for mounting an electronic device can be formed by punching or drilling via holes 12 in a substrate of green state alumina 10. As used herein, "substrate" refers to a layer of material that provides mechanical support for an object, such as an electronic device. A submount includes a substrate and therefore provides mechanical support for an electronic device as well, but a submount may also include features that provide electrical connections such as die attach pads, electrical traces, etc., features that dissipate thermal energy, features that provide optical functionality, such as reflectors and/or lenses, and/or other functionality. The via holes 12 can be plated and/or filled with conductive material 14, such as copper or aluminum, and the green state alumina tape 10 and the vias 12, 14 can be co-fired to transform the green state alumina tape 10 into an alumina substrate 10. Contact pads 16, 18, that electrically connect to the vias 12, 14, can be formed on opposite sides of the alumina substrate 10, for example by plating and patterning metal traces. In this manner, electrically and thermally conductive paths can be formed from one side of the substrate to the other.

SUMMARY

A submount for an electronic device according to some embodiments includes an electrically insulating substrate including first and second surfaces and having a thickness between the first and second surfaces, a thermally conductive pad on the first surface of the substrate, and an electrically inactive thermally conductive via extending from the first surface of the substrate toward the second surface of the substrate and having a length that is less than the thickness of the substrate. The thermally conductive via has a higher thermal conductivity than a thermal conductivity of the substrate. The thermally conductive via may contact the thermally conductive pad.

The thermally conductive via may include an elongated trench in the first surface of the substrate. In some embodiments, the thermally conductive via may include a hole in the substrate having a square or hexagonal cross section.

The submount may further include a second electrically inactive thermally conductive via that extends from the second surface of the substrate toward the first surface of the substrate, that has a second length that is less than the thickness of the substrate, and that is electrically isolated from the first thermally conductive via. The second thermally conductive via also has a higher thermal conductivity than the substrate.

A sum of the lengths of the first and second thermally conductive vias may be greater than the thickness of the substrate, and heat from the thermally conductive pad may be coupled laterally through the electrically insulating substrate between the first thermally conductive via and the second thermally conductive via in a region of overlap between the first thermally conductive via and the second thermally conductive via.

The submount may further include a second thermally conductive pad on the second surface of the substrate and in contact with the second thermally conductive via. The second thermally conductive via may include an elongated trench in the second surface of the substrate in some embodiments. In other embodiments, the second thermally conductive via may have an annular shape in the substrate that surrounds the first thermally conductive via. In some embodiments, the second thermally conductive via may have a circular or square cross section. Likewise, the first thermally conductive via may have an annular shape with a circular or square cross section.

The submount may further include a buried thermally conductive feature in the substrate. The buried thermally conductive feature may include a thermally conductive layer that extends parallel to the second surface of the substrate. The buried electrically conductive feature may contact the thermally conductive via.

The submount may further include a second buried thermally conductive features in the substrate, which may include a thermally conductive layer that extends parallel to the second surface of the substrate. The first buried thermally conductive layer may contact the first thermally conductive via and the second buried thermally conductive layer may contact the second thermally conductive via. The first and second buried thermally conductive features may be electrically insulated from one another by the substrate, and heat from the thermally conductive pad may be coupled laterally through the electrically insulating substrate between the first buried thermally conductive feature and the second buried thermally conductive feature.

The submount may further include a buried thermally conductive feature in the substrate that is electrically insulated from the first conductive via. The buried thermally conductive feature may include a thermally conductive layer that extends parallel to the second surface of the substrate. A second thermally conductive pad may be on the second surface of the substrate, and a thermally conductive trace on a side surface of the substrate may connect the buried thermally conductive feature and the second thermally conductive pad.

The substrate may have a thickness of about 0.3 to 3 mm, and the thermally conductive via may have a length of about 0.1 to 2 mm and an aspect ratio, defined as a ratio of depth of the via to width of the via opening at the surface of the substrate, of about 1 to about 10. The thermally conductive via may have a length of about ⅓ to about ⅘ the thickness of the substrate.

The thermally conductive via may have a tapered profile that is wider near the first surface of the substrate and that becomes more narrow with depth in the substrate.

The first thermally conductive via may have a rectangular profile and may have a width of at least about 0.05 mm to about 1 mm.

Methods of forming a submount for an electronic device according to some embodiments include providing an electrically insulating substrate including first and second surfaces and having a thickness between the first and second surfaces, and forming a thermally conductive pad on the first surface of the substrate, and forming an electrically inactive thermally conductive via that contacts the thermally conductive pad and that extends from the first surface of the substrate toward the second surface of the substrate and that has a length that is less than the thickness of the substrate.

The methods may further include forming a second electrically inactive thermally conductive via that extends from the second surface of the substrate toward the first surface of the substrate, that has a second length that is less than the thickness of the substrate, and that is electrically isolated from the first thermally conductive via.

Forming the thermally conductive via may include laser etching the thermally conductive via into the substrate. The substrate may include alumina and laser etching the thermally conductive via into the substrate may include laser etching the substrate using a CO2 laser.

Methods of forming a submount for an electronic device according to further embodiments include providing first and second green state alumina tapes, forming a first plurality of via holes in the first green state alumina tape and a second plurality of via holes in the second green state alumina tape, at least partially filling the first and second pluralities of via holes with a thermally conductive material having a thermal conductivity higher than a thermal conductivity of alumina, and bringing the first and second green state alumina tapes into contact so that the first plurality of via holes and the second plurality of via holes are laterally offset from one another. The methods further include heat treating the first and second green state alumina tapes to fuse the first and second green state alumina tapes into an alumina substrate including first electrically inactive thermally conductive vias formed by the thermally conductive material in the first plurality of via holes and second electrically inactive thermally conductive vias formed by the thermally conductive material in the second plurality of via holes. The first and second electrically inactive thermally conductive vias are electrically isolated from one another.

The methods may further include providing a third green state alumina tape, and forming a third plurality of via holes and a fourth plurality of via holes in the third green state alumina tape. Bringing the first and second green state alumina tapes into contact may include bringing the first and second green state alumina tapes into contact with the third green state alumina substrate between the first and second green state alumina substrates so that the first plurality of via holes are aligned with the third plurality of via holes and the second plurality of via holes are aligned with the fourth plurality of via holes.

A light emitting device according to some embodiments includes a submount for an electronic device including an electrically insulating substrate including first and second surfaces and having a thickness between the first and second surfaces, a thermally conductive pad on the first surface of the substrate, and a thermally conductive via extending from the first surface of the substrate toward the second surface of the substrate and having a length that is less than the thickness of the substrate. The thermally conductive via has a higher thermal conductivity than a thermal conductivity of the substrate. A solid state light emitting device is on the thermally conductive pad.

A submount for an electronic device according to further embodiments includes an electrically insulating substrate including first and second surfaces and having a thickness between the first and second surfaces, a thermally conductive pad on the first surface of the substrate, and a buried thermally conductive feature in the substrate that is electrically insulated from the thermally conductive pad. The buried thermally conductive feature includes a thermally conductive layer that extends parallel to the second surface of the substrate and that has a higher thermal conductivity than a thermal conductivity of the substrate. A second thermally conductive pad is on the second surface of the substrate, and a thermally conductive trace on a side surface of the substrate connects the buried thermally conductive feature and the second thermally conductive pad.

DETAILED DESCRIPTION OF EMBODIMENTS

Figure 1:
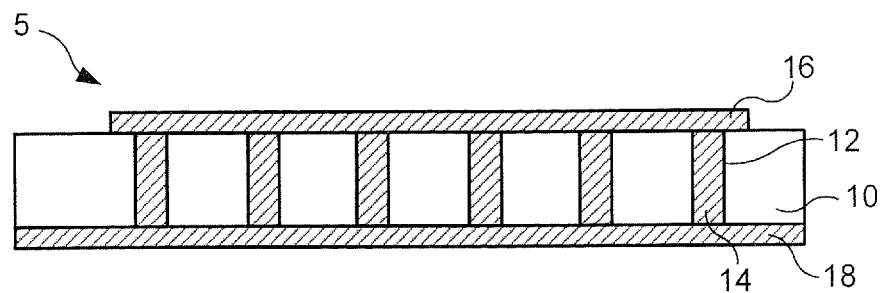
FIG. 1 is a cross-sectional view of a conventional submount for an electronic device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below," "above," "upper," "lower," "horizontal," "lateral," "vertical," "beneath," "over," "on," etc., may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted regions. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Figure 2:
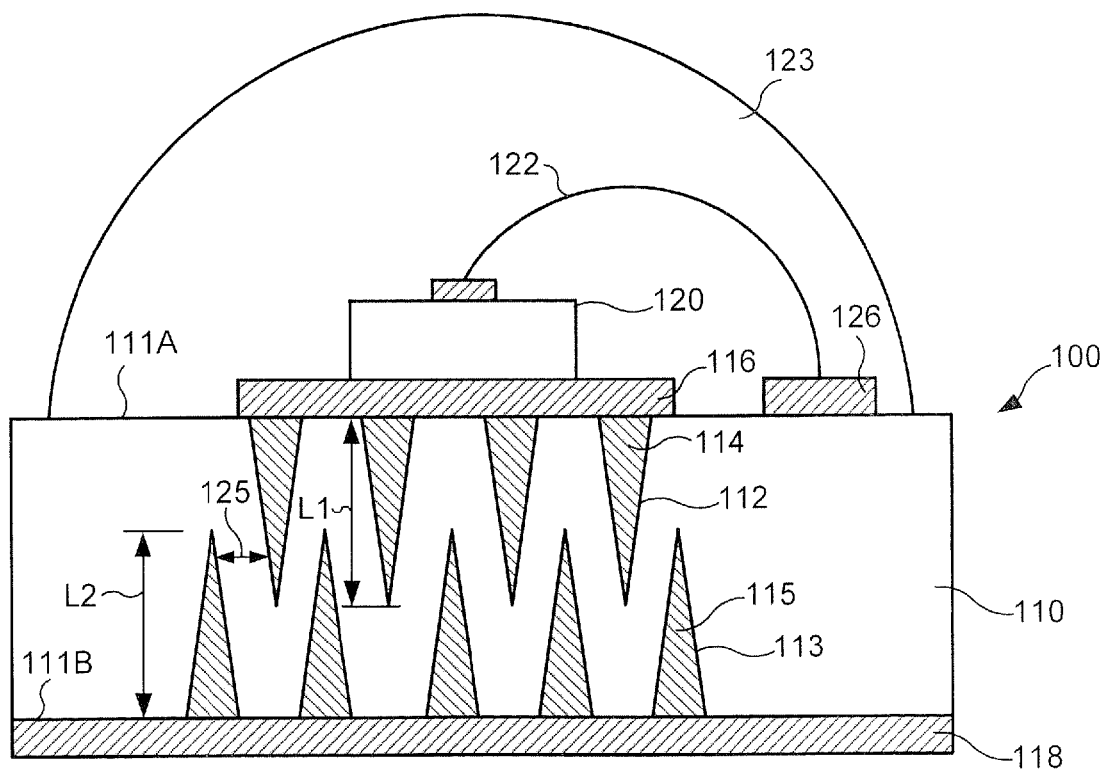
FIG. 2 is a cross-sectional view of a submount according to some embodiments.

FIG. 2 is a cross-sectional view of a submount 100 according to some embodiments. As shown therein, a submount 100 includes an electrically insulating substrate 110 including a first surface 111A and a second surface 111B opposite the first surface 111A. A first thermally conductive pad 116 is formed on the first surface 111A of the substrate 110. A second thermally conductive pad 118 is formed on the second surface 111B of the substrate 110.

A first plurality of thermally conductive vias 112 (referred to herein as thermal vias 112) extend from the first surface 111A of the substrate 110 into, but not completely through, the substrate 110. That is, the thermal vias 112 extend into the substrate 110 from the first surface 111A by a distance that is smaller than the thickness of the substrate 110 between the first surface 111A and the second surface 111B. The thermally conductive vias 112 are at least partially filled and/or plated with a thermally conductive material 114 that is in direct contact and in thermal communication with the thermally conductive pad 116 on the first surface 111A of the substrate 110.

The thermal vias 112 may be electrically inactive. That is, in some embodiments they are not configured to carry electrical current, and do not connect to any other feature of the submount 100 to form a current path for carrying electrical current. Because the thermal vias 112 do not carry electrical current in some embodiments, no heat may be generated within the thermal vias 112 themselves. Rather, the thermal vias conduct heat generated external to the thermal vias 112.

A second plurality of thermally conductive vias 113 extend from the second surface 111B of the substrate 110 into the substrate 110 towards the first surface 111A of the substrate 110. The second plurality of thermally conductive vias 113 may be in direct contact and in thermal communication with the thermally conductive pad 118 on the second surface 111B of the substrate 110.

The first and second thermally conductive pads 116, 118 and the first and second thermally conductive vias 112, 113 may or may not be electrically conductive. In some embodiments, the first and second thermally conductive pads 116, 118 and the first and second thermally conductive vias 112, 113 may comprise a material, such as copper and/or aluminum, that is both thermally and electrically conductive. However, the first thermally conductive vias 112 are electrically insulated from the second thermally conductive vias 113 by the substrate 110.

The first and second thermally conductive vias 112, 113 may decrease the thermal resistance between the first thermally conductive pad 116 and the second thermally conductive pad, so that heat generated by an electronic device 120 mounted on the first thermally conductive pad 116 can dissipated be more efficiently without providing an undesirable electrical path between the first thermally conductive pad 116 and the second thermally conductive pad 118. The thermal conductivity of the thermally conductive vias 112, 113 may be significantly greater than the thermal conductivity of the substrate 110. The proximity of the thermally conductive vias 112, 113 reduces the distance that heat must travel through the more thermally resistive material of the substrate 110. As is well known, thermal resistance is proportional to the thickness of the material through which heat is passing. The thermally conductive vias reduce the effective distance between the thermally conductive pads 116, 118, thereby reducing the thermal resistance of the submount 100.

As illustrated in FIG. 2, in some embodiments, the first plurality of thermally conductive vias 112 may be laterally offset from the second plurality of thermally conductive vias 113, and the first and second thermally conductive vias may overlap in the vertical direction (i.e., the direction normal to the first and second sides 111A, 111B of the substrate 110). The first conductive vias 112 may have a length L1, and the second conductive vias 113 may have a length L2, and the sum of the lengths L1 and L2 may be greater than the thickness of the substrate 110 between the first surface 111A and the second surface 111B of the substrate.

Each of the first and second vias 112, 113 may be electrically isolated from any other feature in the substrate 110 other than the respective pad 116, 118 to which it is connected, and may therefore be configured so that electrical current cannot flow through the thermally conductive vias 112, 113. That is, the vias 112, 113 may not be used, for example, for forming electrical connections in the substrate, such as multi-level electronic connections. The vias 112, 113, may therefore be distinguished from electrical interconnection lines used in multilayered electronic substrates.

As further illustrated in FIG. 2, one or more electronic devices 120, such as a semiconductor light emitting diode, a semiconductor laser diode and/or other electronic device, may be mounted on one of the thermally conductive pads 116. 118, such as on the thermally conductive pad 116 on the first surface 111A of the substrate 110. In some embodiments, the electronic device 120 may be a solid state lighting device, which may be wire bonded via a wire bond 122 to a wire bond pad 126, also on the first surface 111A of the substrate 110. An encapsulant dome 123 of a material such as silicone, epoxy resin, or the like, is formed over the electronic device 120 to provide environmental and mechanical protection, index matching, lensing, or other functions. Furthermore, a phosphor such as yttrium aluminum garnet (YAG) can be coated on the electronic device and/or embedded within the encapsulant dome 123 to provide wavelength conversion of light emitted by the electronic device 120. Other features, such as electrostatic discharge protection devices, reflectors, diffusers, etc., can be mounted on and/or formed in the substrate 110.

It will be appreciated that a solid state lighting device, such as a solid state light emitting diode, can generate a significant amount of heat. For example, some solid state light emitting diodes operate at currents of 1000 mA or more at a forward voltage of 3.3 V, resulting in a significant power dissipation from a single chip. When multiple chips are packaged together on a single substrate, the heat dissipation requirements are even greater. In order to keep the device at an acceptable operating temperature, it may be desirable for the submount to provide a heat transfer path that draws heat away from the semiconductor device 120 and transfers it to a lower temperature region, such as an external heatsink, where the heat can be dissipated.

The vias 12 illustrated in FIG. 1 can be used for such thermal dissipation. However, it may be desirable for the electronic device 122 to remain electrically insulated from the bottom of the substrate 110. Therefore, in some embodiments, it may not be desirable to provide an electrical communication path from the first surface 111A of the substrate 110 to the second surface 111B of the substrate 110 and/or from the first thermally conductive pad 116 on the first surface 111A of the substrate 110 to the second thermally conductive pad 118 on the second surface 111B of the substrate 110. Accordingly, in some embodiments, thermally conductive vias 112, 113, are provided that are not in electrical communication with one another. Thermal communication through the substrate 110 is enhanced by forming the vias 112, 113, because they may shorten the thermal path from the first thermally conductive pad 116 through the substrate 110 to the second thermally conductive pad 118. In particular, where the thermally conductive vias overlap one another, the thermal path from the first vias 112 to the second vias 114 may be significantly shortened relative to the thermal path that would otherwise exist from the first surface 111A of the substrate 110 to the second surface 111B of the substrate 110. The effective thermal path between the first and second vias 112, 113 may be shortened to the lateral distance between overlapping portions of adjacent ones of the vias 112, 113, and thermal communication between the adjacent vias 112, 113 may occur through a lateral thermal path 125, as illustrated in FIG. 2.

In some embodiments, the thermally conductive material 114, 115 in the first and second plurality of vias 112, 113 may include a highly thermally conductive material, such as copper and/or aluminum.

Thermal conductivity, measured in Watts per meter-Kelvin, is the property of a material that indicates its ability to conduct heat. Metals in particular tend to be highly thermally conductive, because freely moving valence electrons transfer not only electric current but also heat energy. As used herein, "highly thermally conductive" refers to a material with a thermal conductivity greater than about 50 W/(m-K). In particular, aluminum has a thermal conductivity greater than about 200 W/(m-K), while copper has a thermal conductivity of greater than about 300 W/(m-K). In contrast, alumina has a thermal conductivity of only about 40 W/(m-K). It will be appreciated that the thermal conductivity of a material will vary with the exact composition of the material in question and also with the temperature of the material. Thermal conductivity of materials is typically measured at a standard temperature of 20° C.

Figure 3A:
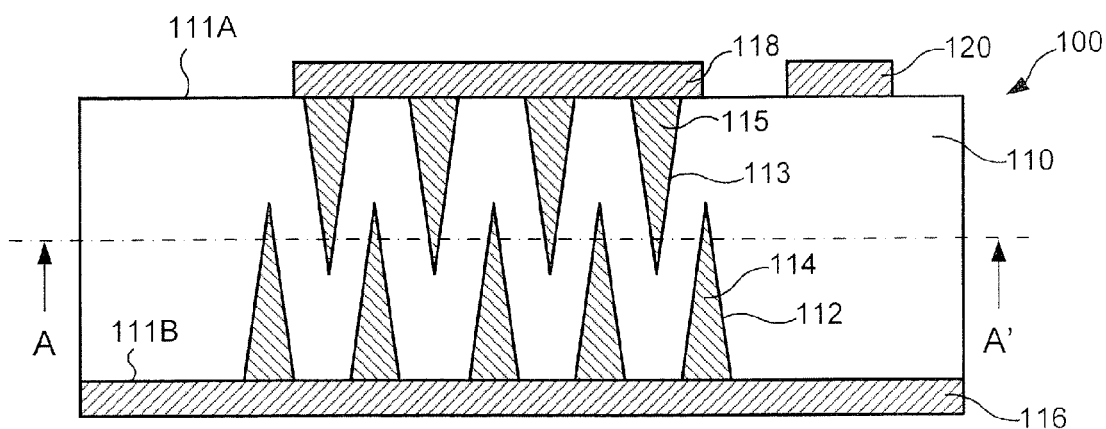
FIG. 3A is a cross-sectional view of a submount according to some embodiments
Figure 3B:
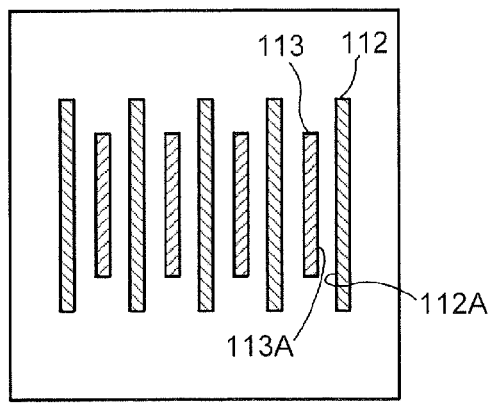
FIGS. 3B, 3C, 3D and 3E are planar cross-sectional views taken along line A-A' of the submount of FIG. 3A.

FIG. 3A is a cross-sectional view of a submount 100 according to some embodiments, and FIGS. 3B through 3E are planar cross-sectional views taken along line A-A' of FIG. 3A. As illustrated in FIG. 3B, the first and second plurality of thermally conductive vias 112, 113 can be formed as elongated trenches in the substrate 110. Forming the thermally conductive vias 112, 113 as elongated trenches may increase heat transfer between the vias, thereby improving heat dissipation from the electronic device 120. For example, heat transfer (i.e., thermal communication, may be enhanced when the thermally conductive vias 112, 113 have respective flat surfaces 112A, 113A, that face each other in a lateral plane in the substrate.

Figure 3C:
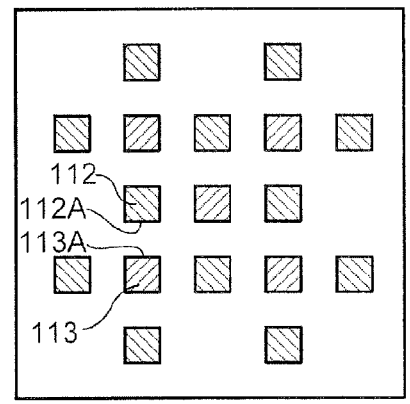
Figure 3D:
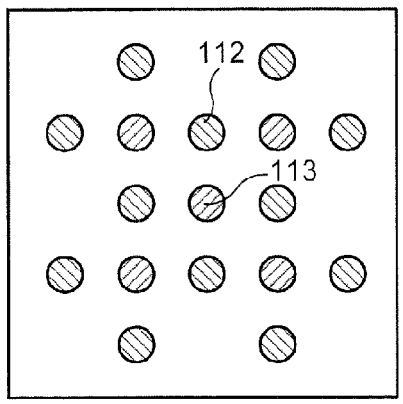
Figure 3E:
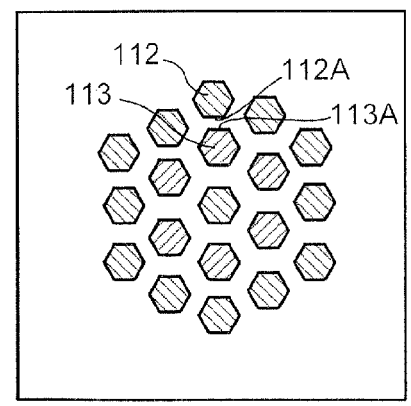

In other embodiments illustrated in FIGS. 3C-3E, the first and second plurality of thermally conductive vias 112, 113 can be formed as posts or pillars having square (FIG. 3C) circular (FIG. 3D), hexagonal (FIG. 3E) or other regular or irregular geometric cross-sections. In particular, heat transfer may be improved when the vias 112, 113 have cross sectional shapes, such as square or hexagonal shapes, that have respective flat surfaces 112A, 113A that face each other.

Figure 4A:
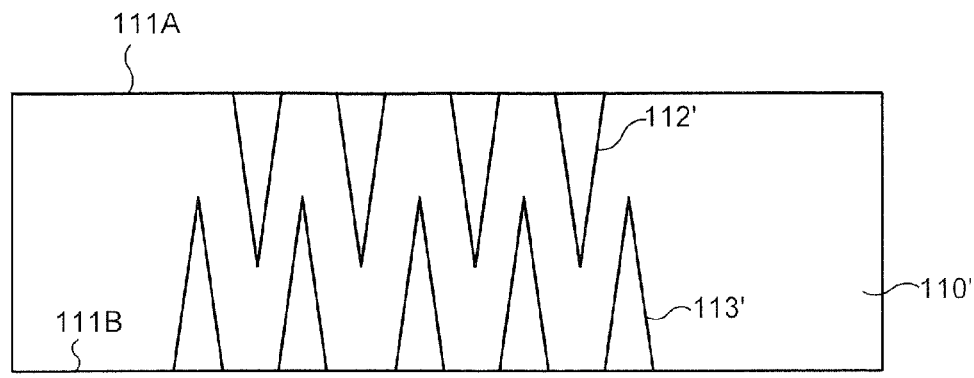
FIGS. 4A, 4B and 4C illustrate methods of forming submounts according to some embodiments.
Figure 4B:
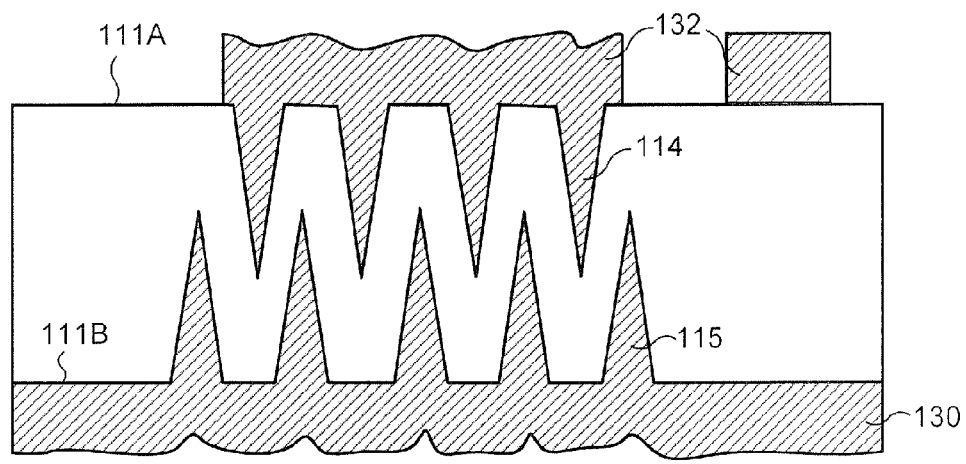
Figure 4C:
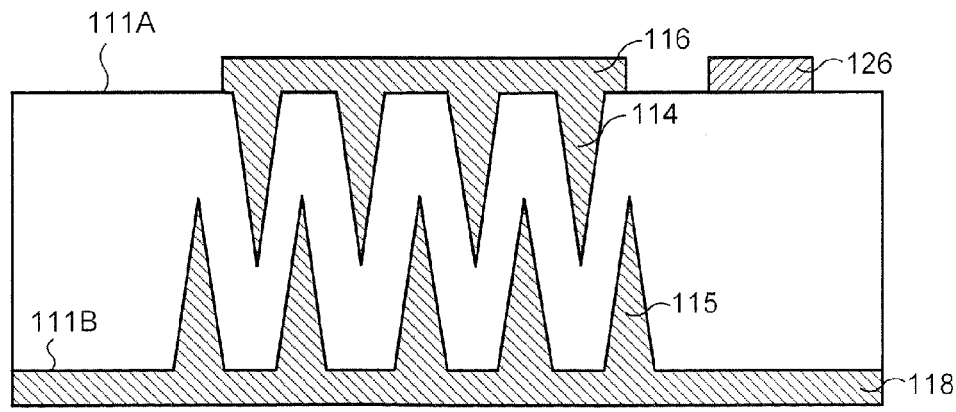

FIGS. 4A to 4C illustrate methods of forming submounts according to some embodiments. Referring to FIG. 4A, a substrate 110' may be provided, and via holes 112' and 113' can be formed therein. The via holes 112', 113' extend from respective upper and lower surfaces 111A, 111B into the substrate 110'. The substrate 110' can be formed of alumina (in green state or other form), aluminum nitride, undoped silicon, FR4 PCB, or any other electrically insulating material. In embodiments in which the substrate 110' is formed of green state alumina, the via holes 112', 113' can be formed by stamping, pressing, cutting, drilling or other means. In embodiments in which the substrate 110' is alumina, aluminum nitride, or other ceramic material, the via holes 112', 113' may be drilled, milled, bored, and/or laser etched into the substrate 110'.

In particular, laser etching of alumina may be performed using a focused laser beam having a wavelength of 10.6 μm such as a $CO_2$ or similar industrial laser, and may produce a via hole having a tapered profile that is wider near the first surface of the substrate and that become more narrow with depth in the substrate, as illustrated in FIG. 4A. The tapered profile of the vias may permit more dense placement of the vias, thereby enhancing heat transfer between the vias.

In some embodiments, the substrate 110' may have a thickness of about 0.3 mm to about 3 mm, the via holes 112' 113' may extend a depth of at least about 0.1 mm to 2 mm, and in some embodiments about 0.25 mm into the substrate, and may have a width of about 0.05 mm at the opening thereof. In one aspect, the via holes may extend to a length of about ⅓ to about ⅘ of the thickness of the substrate 110. In some embodiments, the via holes 112', 113' may overlap vertically by about 0.18 to 1.8 mm or about 60% of the substrate thickness.

Furthermore, the via holes 112', 113' may be formed to have an aspect ratio, defined as a ratio of the depth of the via hole to the width of the opening of the via hole at the surface of the substrate of about 1 to about 10, and in some cases an aspect ratio of about 5. Providing via holes having an aspect ratio in this range may enable the holes to be substantially filled with thermally conductive material, which may enhance the thermal communication properties of the resulting structure.

Referring to FIG. 4B, a layer 132 of highly thermally conductive material is deposited on the upper surface 111A of the substrate 110' while a layer 130 of highly thermally conductive material is deposited on the lower surface 111B of the substrate 110'. Deposition and patterning of highly thermally conductive materials such as copper and/or aluminum, is well known in the art. In particular, an electrolytic plating method may be used to form a seed layer, for example of titanium, and a metal, such as copper, aluminum, nickel, gold, ENIG (electroless nickel-gold), etc., may be plated onto the seed layer and may at least partially fill the via holes 112', 113', to thereby form thermally conductive vias 112, 113 that extend partially into the substrate 110. The thermally conductive material 132, 130 may be deposited to a thickness of about 50 μm to about 100 μm, and in particular to a thickness of about 75 μm.

Following deposition, the layers 130, 132 may be scrubbed, burnished and/or polished to provide a suitably flat surface for mounting electric device thereon, and/or for mounting the sub mount to a component, such as the heatsink, as illustrated in FIG. 4C.

Figure 5A:
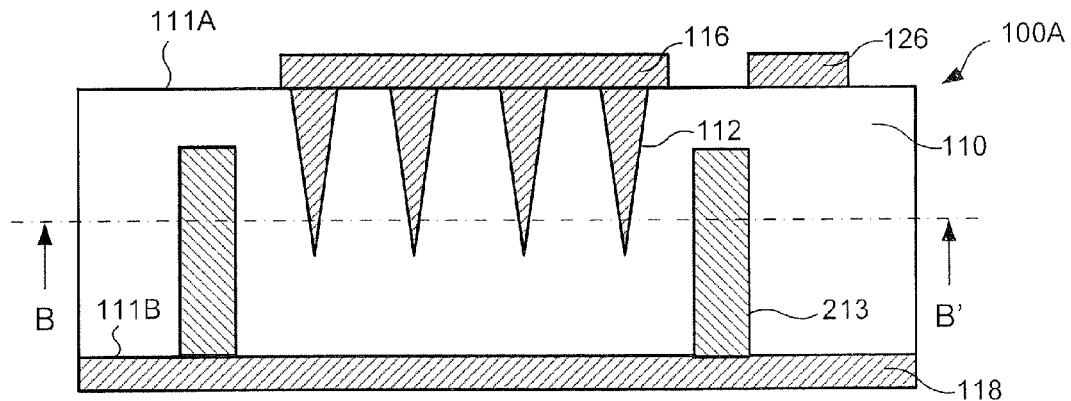
FIG. 5A is a cross-sectional view of a submount according to some embodiments
Figure 5B:
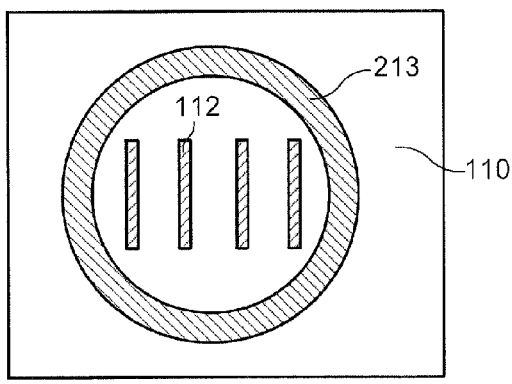
FIGS. 5B, 5C, 5D and 5E are planar cross-sectional views taken along line B-B' of the submount of FIG. 5A.
Figure 5C:
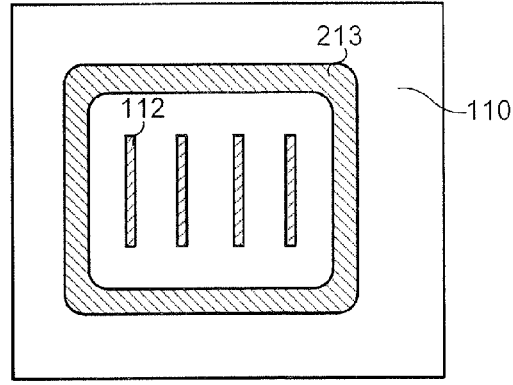
Figure 5D:
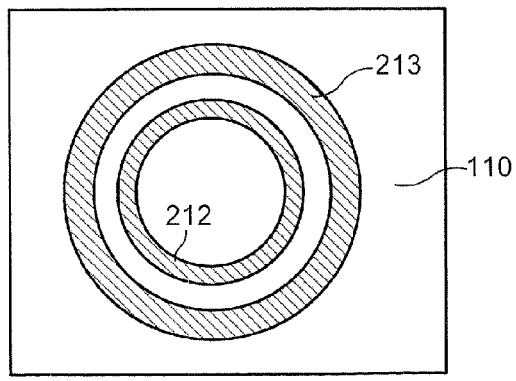
Figure 5E:
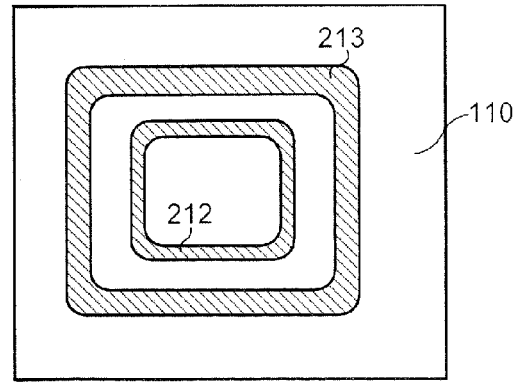

FIG. 5A is a cross-sectional view of a submount 100 A according to further embodiments of the invention. FIGS. 5B and 5C are planar cross-sectional views of the structure of FIG. 5A taken along section line B-B'. FIGS. 5D and 5E are planar cross-sectional views of submounts according to further embodiments.

As illustrated in FIGS. 5B and 5C, the first thermally conductive vias 112 may be configured as illustrated in previous embodiments. A second thermally conductive via 213 may be provided as a single element having a generally annular or square cross-section, as illustrated in FIGS. 5B and 5C, and may at least partially surround the first plurality of thermally conductive vias 112 in a plane in which the first conductive vias 112 and the second conductive via 213 overlap.

As illustrated in FIGS. 5D and 5E, the first conductive via may also be provided as a single member 212 having a generally annular or square shaped cross section extending into the substrate 110 and overlapping the second conductive via 213.

FIGS. 6A through 6D are cross sectional views that illustrate submounts according to further embodiments. For example, in the submount 100B illustrated in FIG. 6A, the first plurality of conductive thermally conductive vias 112 and the second plurality of thermally conductive vias 113 are vertically aligned with one another and do not overlap in any horizontal plane of the substrate 110. However, thermal communication between the first plurality of thermally conductive vias 112 and the second plurality of thermally conductive vias 113 may be enhanced by the proximity of the vias to one another, which may nevertheless reduce the thermal resistance of the submount 100B relative to a submount without thermally conductive vias.

Figure 6A:
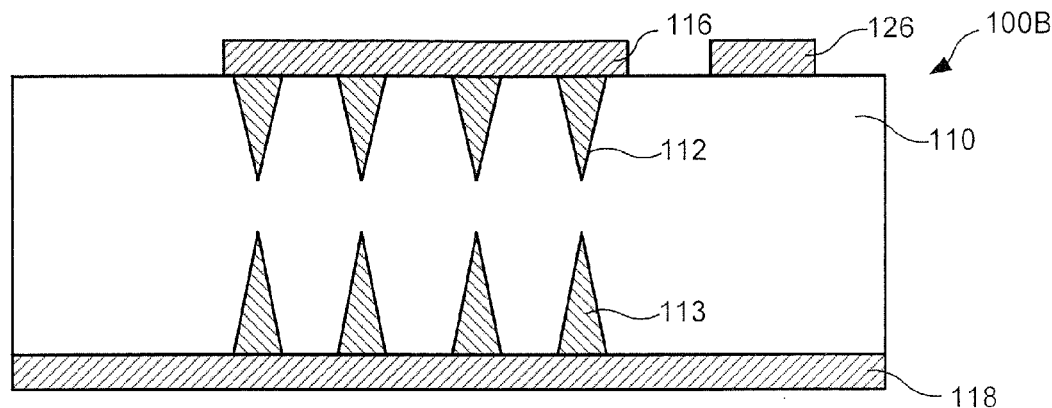
FIGS. 6A, 6B, 6C, 6D, 6E and 6F are cross-sectional views of submounts according to some embodiments.
Figure 6B:
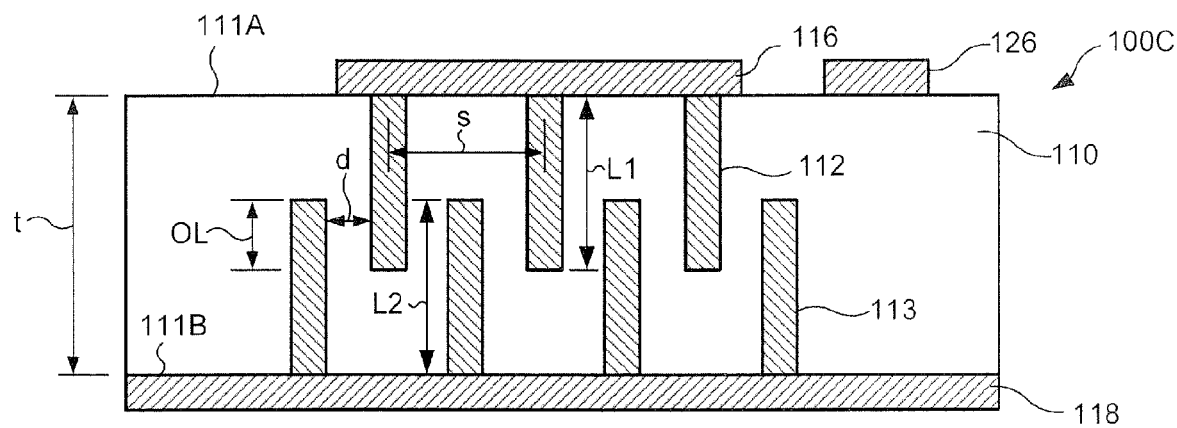

FIG. 6B illustrates a submount 100C according to further embodiments in which the first plurality of thermally conductive vias 112 and the second plurality of thermally conductive vias 113 have generally rectangular cross sectional shapes, such as may be formed by punching, stamping and/or drilling a green state alumina tape prior to firing thereof. The vias 112, 113 may have widths of 0.01 mm to about 0.2 mm (range), and in some embodiments at least about 0.05 mm to facilitate heat transfer. FIG. 6B also illustrates that thermal communication between the first plurality of conductive vias 112 and the second plurality of thermally conductive vias 113 may be enhanced by increasing the amount of overlap OL of the first plurality of conductive vias 112 and the second plurality of thermally conductive vias 113. Thermal communication may also be enhanced by decreasing the lateral spacing or distance d between adjacent ones of the first plurality of conductive vias 112 and the second plurality of thermally conductive vias 113. Furthermore, FIG. 6B illustrates that the sum of the lengths L1 and L2 of the first plurality of thermally conductive vias 112 and the second plurality of thermally conductive vias 113, respectively, may be greater than the total thickness t of the substrate 110 between the first surface 111A and a second surface 111B thereof.

Center to center spacing s of the thermal vias 112, 113 may be about 0.3 mm or less, so that the distance d between adjacent vias 112, 113 may be less than about 0.15 mm, which may increase thermal communication between adjacent ones of the vias 112 and the vias 113.

In some embodiments, the substrate 110 may be about 0.3 mm to 3 mm thick. The thermal vias 112, 113 may have lengths L1, L2 of at least about half the thickness of the substrate 110, although in some embodiments, the thermal vias 112, 113 may have lengths less than half the thickness of the substrate 110.

In some embodiments, the thermal vias 112, 113 may overlap (OL) vertically by about 0.18 mm to about 1.8 mm and/or by about 60% of the substrate thickness.

Figure 6C:
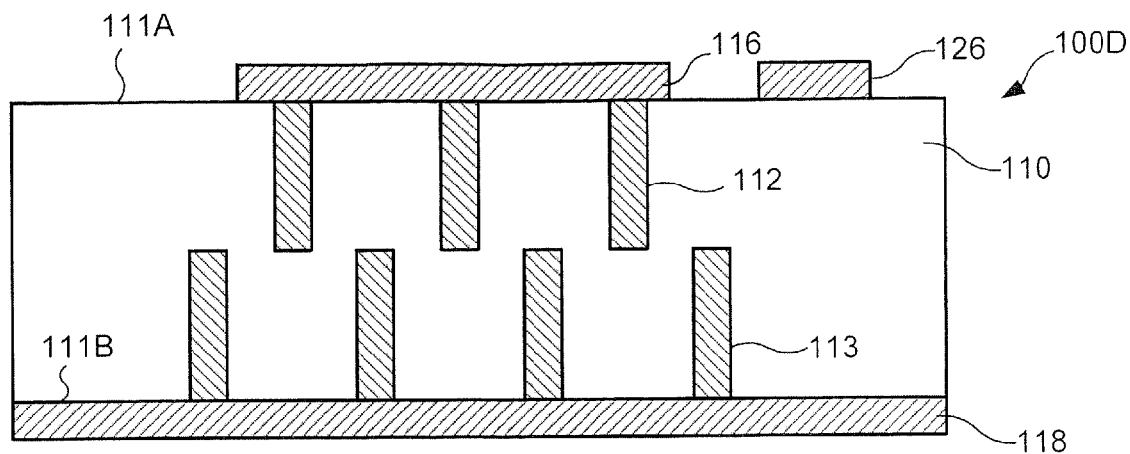
Figure 6D:
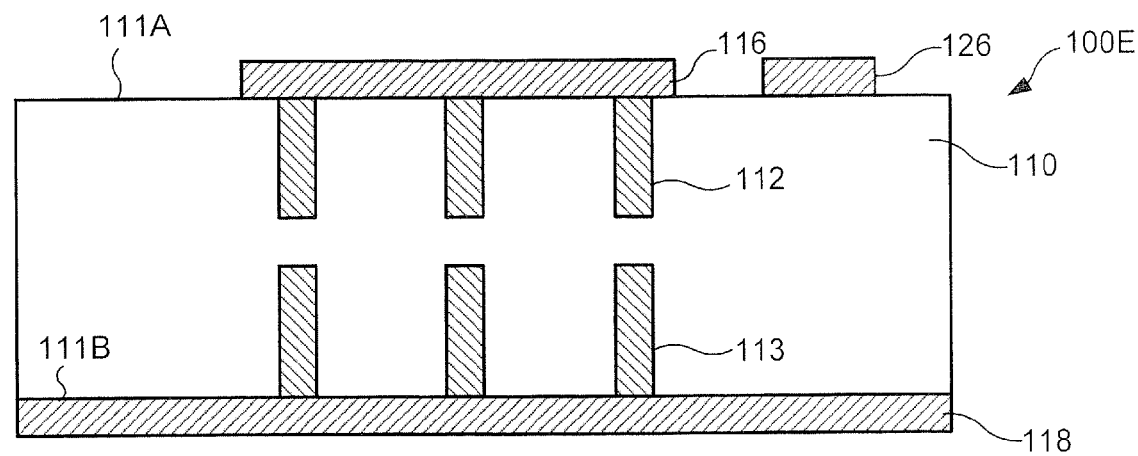

Referring to FIG. 6C, in some embodiments, a submount 100D may include a first plurality of thermally conductive vias 112 and a second plurality of thermally conductive vias 113 that are laterally offset but that do not overlap in a horizontal plane (i.e., in the vertical direction). FIG. 6D illustrates a submount 100E according to further embodiments in which the first plurality of thermally conductive vias 112 and the second plurality of vias thermally conductive vias 113 are vertically aligned and do not overlap in a horizontal plane of the substrate 110. However, it will be appreciated that providing vias as configured in the submount 100D illustrated in FIG. 6D may reduce the mechanical integrity of the submount 100D.

Figure 6E:
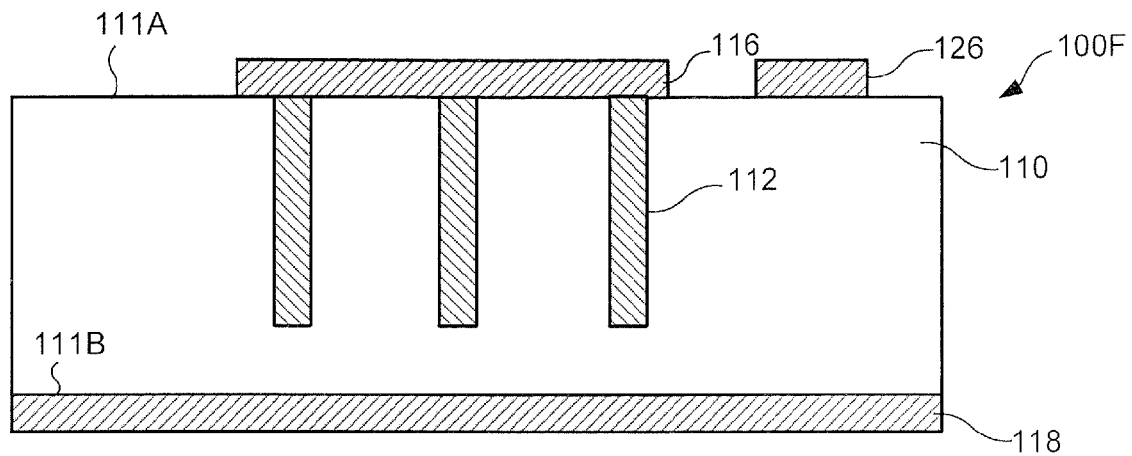

FIG. 6E illustrates a submount 100F according to further embodiments in which a plurality of thermal vias 112 extends from a first side 11A of the substrate 110 towards the second side 111B of the substrate 110. The thermal vias 112 have lengths that are less than the thickness of the substrate 110.

Figure 6F:
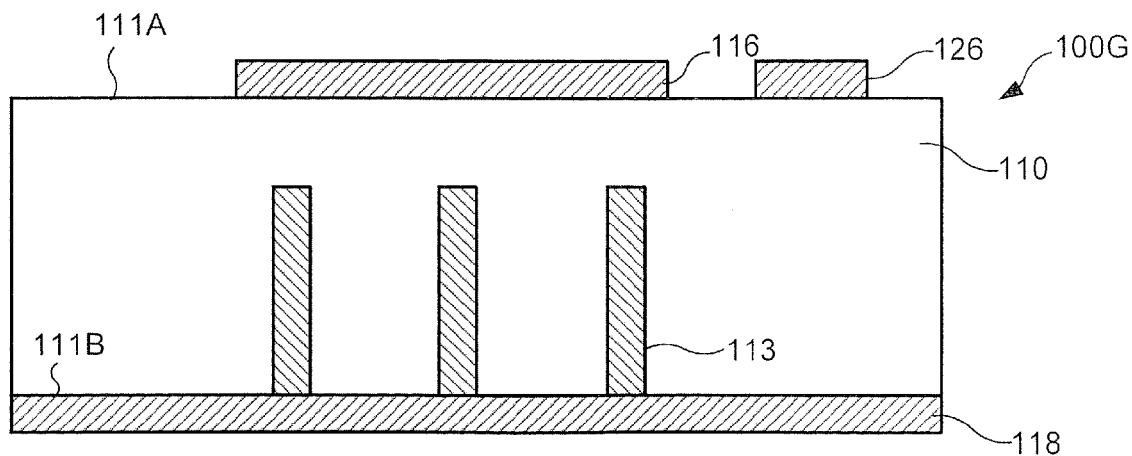

FIG. 6F illustrates a submount 100G according to further embodiments in which a plurality of thermal vias 113 extends from a second side 111B of the substrate 110 towards the first side 111A of the substrate 110 on which the thermally conductive pad 116 that is configured to receive an LED is formed. The thermal vias 113 have lengths that are less than the thickness of the substrate 110.

Figure 7A:
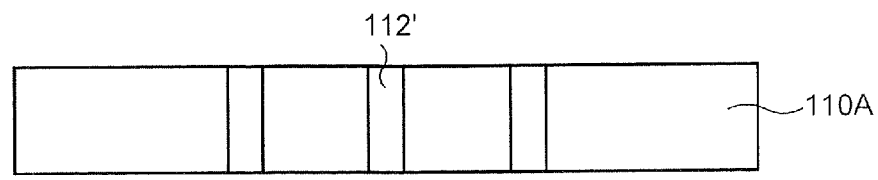
FIGS. 7A, 7B and 7C illustrate methods of forming submounts according to some embodiments.
Figure 7A:
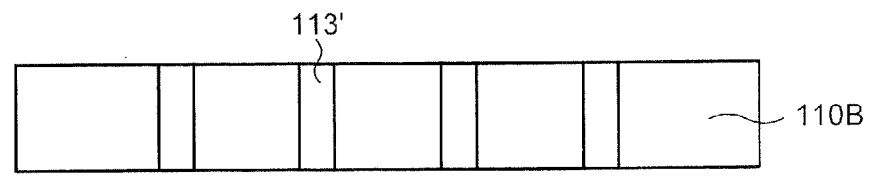
Figure 7B:
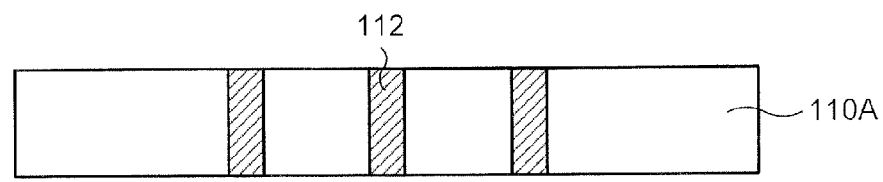
Figure 7B:
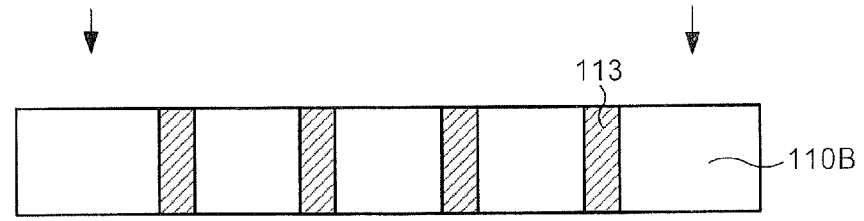
Figure 7C:
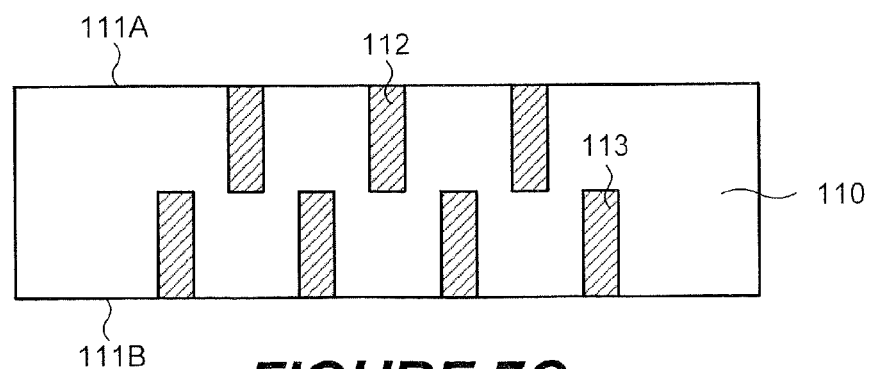

FIGS. 7A to 7C illustrate methods of forming submounts according to some embodiments. Referring to FIG. 7A, a plurality of first holes 112' are formed in a green state alumina tape 110A, and a plurality of second the holes 113' are formed in a second green state alumina tape 110B. The first plurality of holes 112' in the first green state alumina tape 110A may be laterally offset from the second plurality of holes 113' in the second green state alumina tape 110B.

Referring to FIG. 7B, the first and second holes 112', 113' may be filled with a thermally conductive material, such as a metal, and the first and second green state alumina tapes 110A, 110B may be fused together. For example they may be align using registration holes or other means and pressed together, and the resulting structure may be fired, for example at a temperature greater than 1000° C., to cause the first and second green state alumina tapes 110A, 110B to fuse together to form a spinel alumina substrate 110 as illustrated in FIG. 7C. The fused substrate 110 includes a first plurality of thermally conductive vias 112 extending from a first side 111A of the substrate 110 and into the substrate 110 and a second plurality of thermally conductive vias 113 extending from a second side 111B of the substrate 110 and into the substrate 110.

Figure 8A:
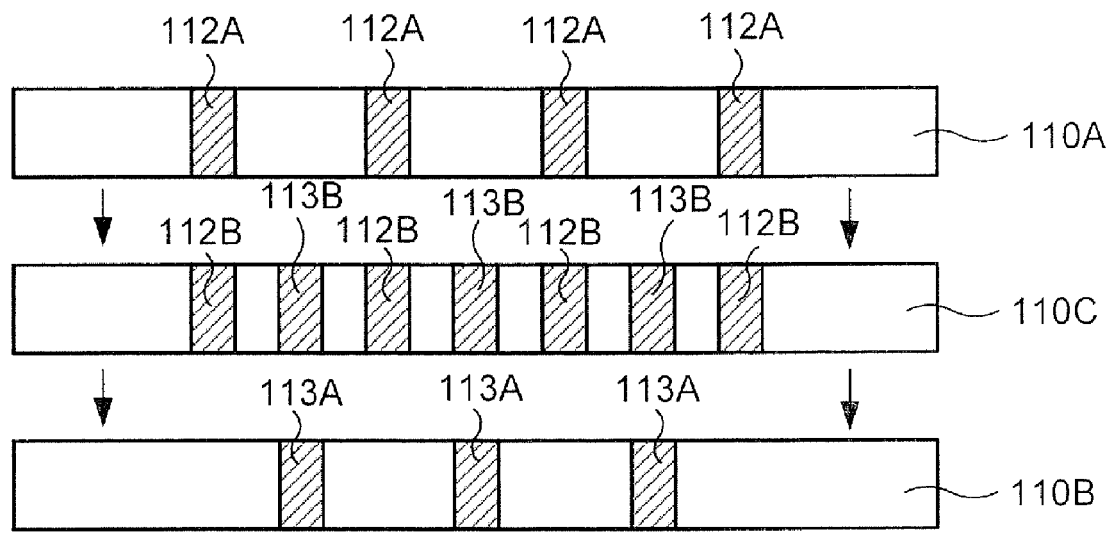
FIGS. 8A and 8B illustrate methods of forming submounts according to some embodiments.
Figure 8B:
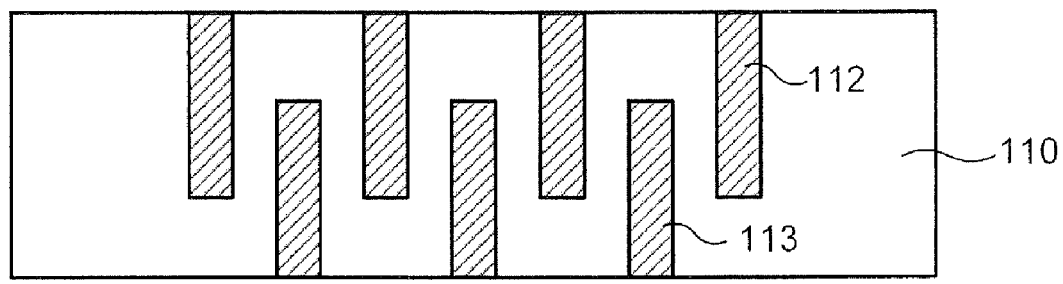

FIGS. 8A and 8B illustrate methods of forming a submount according to further embodiments in which three green state alumina tapes 110A, 110B, 110C are provided. The first green state alumina tape 110A includes a first plurality of thermally conductive vias 112A, and a second green state alumina tape 110B includes a second plurality of thermally conductive vias 113A therein, which are laterally offset from the first plurality of conductive vias 112A in the first green state alumina tape 110A.

A third green state alumina tape 110C is provided between the first and second green state alumina tapes 110A, 110B. The third green state alumina tape 110C includes a third plurality of thermally conductive vias 112B that are vertically aligned with the first plurality of electrically conductive vias 112A in the first green state substrate 111A, and a fourth plurality of thermally conductive vias 113B that are vertically aligned with the second plurality of thermally conductive vias 113A in the second green state alumina tape 110B.

The first, second, and third green state alumina tapes 110A to 110C are pressed together and fired so that the first, second, and third green state alumina tapes 110A to 110C fuse together to form a single alumina substrate 110. The first plurality of thermally conductive vias 112A may fuse with the third plurality of thermally conductive vias 112B to form a plurality of thermally conductive vias 112 in the fused substrate 110. Likewise, the second plurality of thermally conductive vias 113A may fuse together with the fourth plurality of thermally conductive vias 113B to form a plurality of thermally conductive vias 113 in the fused alumina substrate 110.

Figure 9:
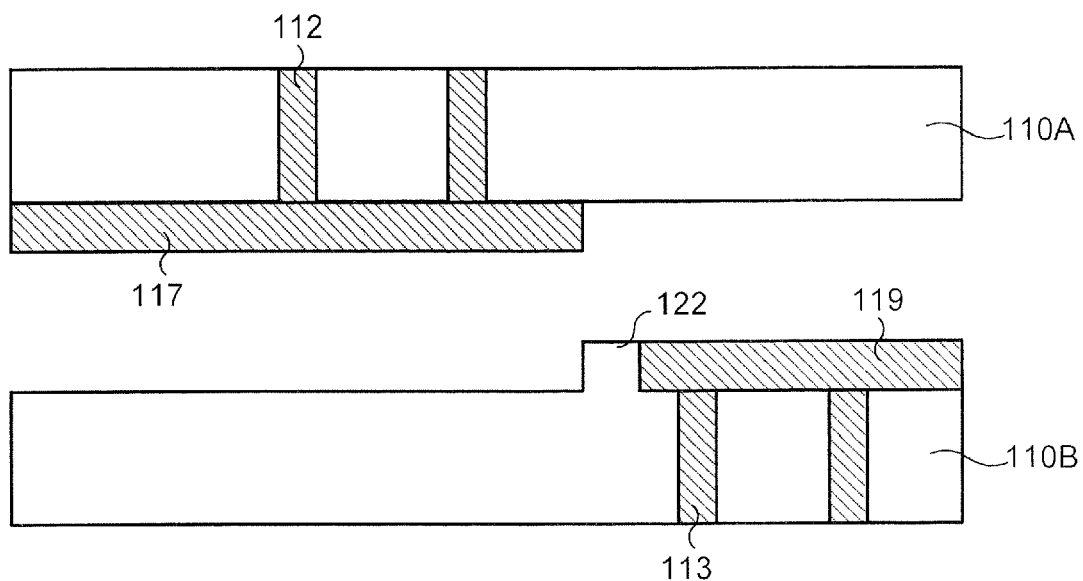
FIGS. 9 and 10 illustrate methods of forming submounts according to some embodiments.
Figure 10:
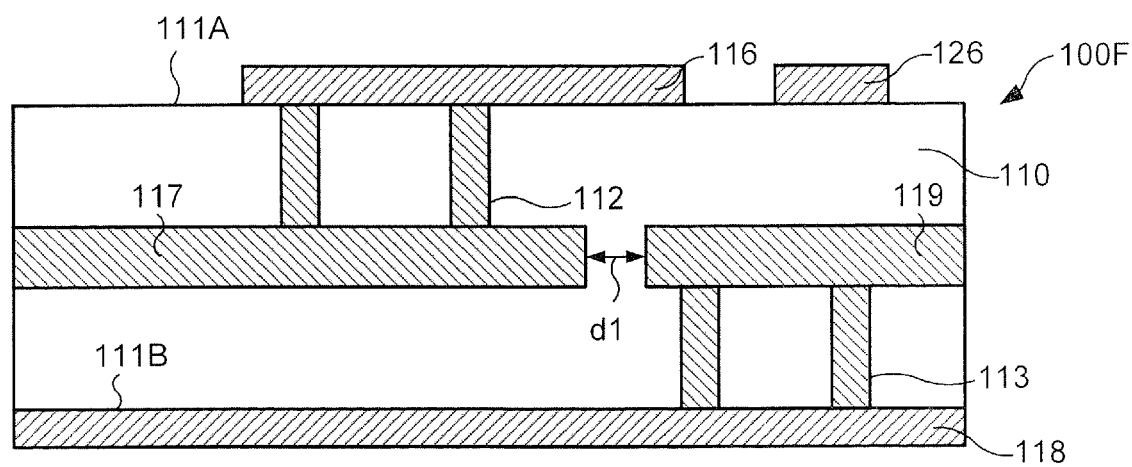

FIGS. 9 and 10 illustrate submounts and methods of forming the same according to further embodiments. For example, as illustrated in FIG. 9, a first green state alumina tape 110A may be provided. A plurality of thermally conductive vias 112 may be formed in the first green state alumina tape 110A. A thermally conductive feature 117, such as a thermally conductive metal trace, may be formed on one side of the first green state alumina tape 110A. Similarly, a second green state alumina tape 110B may be provided having one or more thermally conductive vias 113 therethrough that are in contact with a second thermally conductive feature 119 on one side of the second green state alumina tape 110B. In some embodiments, a protrusion 122 may be formed adjacent at least one of the thermally conductive features 117, 119 on at least one of the green state alumina tapes 110A, 110B. The first and second thermally conductive features 117, 119 may be formed to have thicknesses greater than about 100 µm, which may enhance thermal communication between the features in the completed submount.

When the first and second green state alumina tapes are brought into contact and fired, the first and second green state alumina tapes 110A, 110B may fuse together to form a single alumina substrate 110 including thermally conductive features 117, 119 buried therein. As illustrated in FIG. 10, the first thermally conductive buried feature 117 may be in direct thermal communication with a thermally conductive pad 116 on a first side 111A of the substrate 110 through the first plurality of thermally conductive vias 112, while the second thermally conductive buried feature 119 may be in direct thermal communication with a thermally conductive pad 118 on the second side 111B of the substrate 110 through the second plurality of thermally conductive vias 113.

The first thermally conductive buried feature 117 and the second thermally conductive buried feature 119 may be in indirect thermal communication with one another across a lateral distance d1 through the substrate 110.

Although the first thermal vias 112 contact the first thermally conductive buried feature 117 and the second thermal vias 113 contact the second thermally conductive buried feature 119, the first and second thermal vias 112, 113 may remain electrically inactive, as the buried features 117, 119 may also not be configured to carry electrical current.

Figure 11:
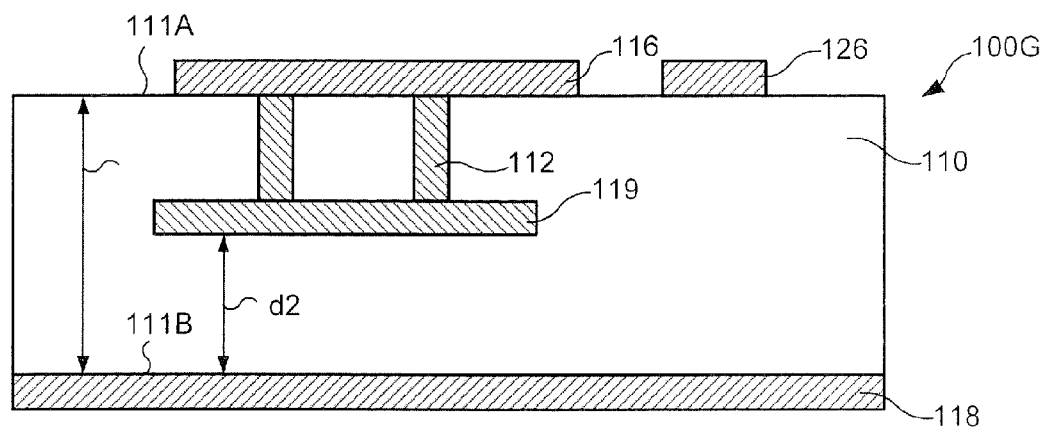
FIGS. 11, 12 and 13 are cross-sectional views of submounts according to some embodiments.

In some embodiments, such as the submount 100G illustrated in FIG. 11, only a single buried thermally conductive feature 119 may be provided, which may be in thermal communication with the second thermally conductive pad 118 through the substrate 110 across a distance d2.

Figure 12:
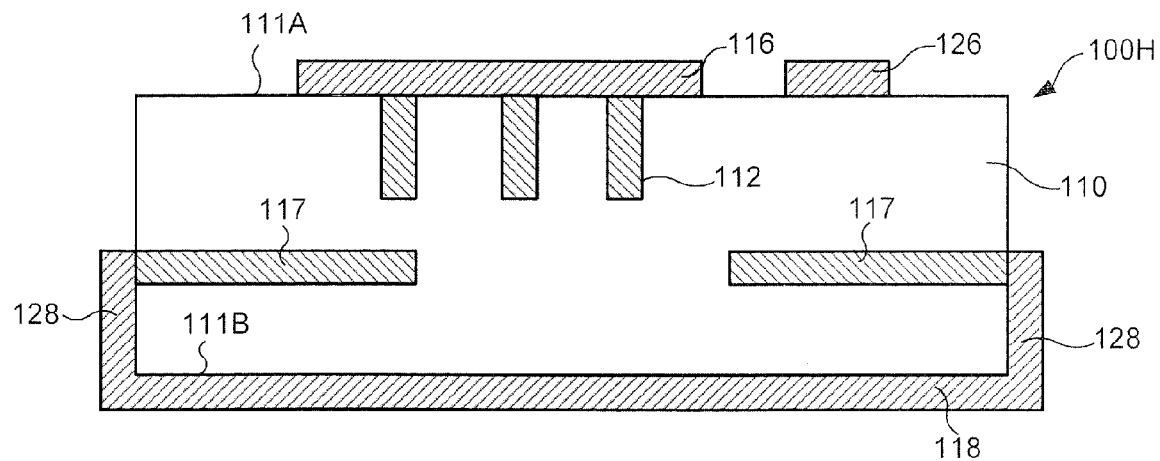

Further embodiments are illustrated in FIG. 12, in which a submount 100H is shown. The submount 100H includes a first plurality of thermally conductive vias 112 extending from a first side 111A of a substrate 110 towards a second side 111B of the substrate 110. The first plurality of thermally conductive vias 112 are in direct contact with a first thermally conductive pad 116 on the first side 111A of the submount 110, and extend towards the second side 111B of the submount 110. One or more buried thermally conductive features 117 are formed within the substrate 110 according to the methods described above. Furthermore, the buried thermally conductive regions 117 are connected to the second thermally conductive pad 118 on the second side 111B of the substrate 110 by means of thermally conductive features 128 that extend along sidewalls 111C of the substrate 110 between the buried thermally conductive features 117 and the second thermally conductive pad 118.

Figure 13:
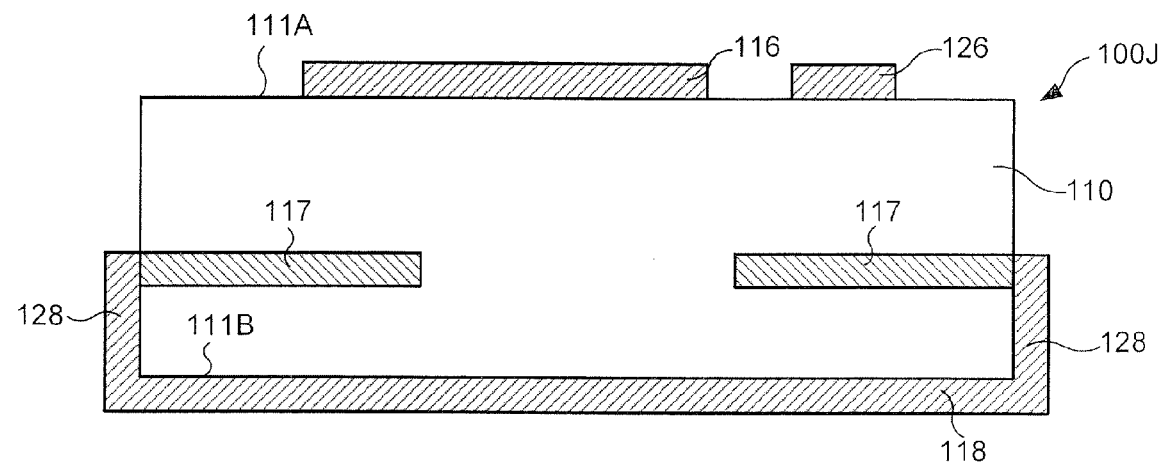

Still further embodiments are illustrated in FIG. 13, in which a submount 100J is shown. The submount 100H includes one or more buried thermally conductive features 117 formed within the substrate 110 according to the methods described above. Furthermore, the buried thermally conductive regions 117 are connected to the second thermally conductive pad 118 on the second side 111B of the substrate 110 by means of thermally conductive features 128 that extend along sidewalls 111C of the substrate 110 between the buried thermally conductive features 117 and the second thermally conductive pad 118. However, in the submount 100J, there are no thermally conductive vias 112 extending from the first side 111A of the substrate 110 into the substrate 110. Thermal conduction from the first thermally conductive pad 116 to the second thermally conductive pad 118 may nevertheless be enhanced due to the presence of the buried thermally conductive regions 117.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

Although particular embodiments are described herein with reference to submounts for solid state lighting devices, it will be appreciated that a submount according to the present invention may be used for mounting other types of electronic devices, such as power and/or microwave semiconductor devices that may generate large amounts of heat.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A submount for an electronic device, comprising:
an electrically insulating substrate including first and second surfaces and having a thickness between the first and second surfaces;
a first thermally conductive pad on the first surface of the substrate; and
an a first electrically inactive thermally conductive via extending from the first surface of the substrate toward the second surface of the substrate and having a first length that is less than the thickness of the substrate, wherein the thermally conductive via has a higher thermal conductivity than a thermal conductivity of the substrate and has substantially vertical sidewalls relative to the first surface of the substrate;
a second thermally conductive pad on the second surface of the substrate; and
a second electrically inactive thermally conductive via extending from the second surface of the substrate toward the first surface of the substrate and having a second length that is less than the thickness of the substrate, wherein the first thermally conductive via has a higher thermal conductivity than the thermal conductivity of the substrate and has substantially vertical sidewalls relative to the second surface of the substrate;
wherein a sum of the first length and the second length is greater than the thickness of the substrate;
wherein the first and second electrically inactive thermally conductive vias overlap within the substrate by a distance OL and are spaced apart by a distance d; and
wherein heat from the first thermally conductive pad is coupled laterally through the electrically insulating substrate between the substantially vertical sidewall of the first thermally conductive via to the substantially vertical sidewall of the second thermally conductive via in a region of overlap between the first thermally conductive via and the second thermally conductive via.

2. The submount of claim 1, wherein the first thermally conductive via contacts the first thermally conductive pad.

3. The submount of claim 1, wherein the first thermally conductive via comprises an elongated trench in the first surface of the substrate.

4. The submount of claim 1, wherein the first thermally conductive via comprises a hole in the substrate having a square or hexagonal cross section.

5. The submount of claim 1, wherein the second thermally conductive via comprises an elongated trench in the second surface of the substrate.

6. The submount of claim 1, wherein the second thermally conductive via has an annular shape in the substrate that surrounds the first thermally conductive via.

7. The submount of claim 6, wherein the second thermally conductive via has a circular or square cross section.

8. The submount of claim 7, wherein the first thermally conductive via has an annular shape with a circular or square cross section.

9. The submount of claim 1, further comprising first and second buried thermally conductive features in the substrate, wherein the first and second buried thermally conductive features comprise thermally conductive layers that extend parallel to the second surface of the substrate, wherein the first buried thermally conductive layer contacts the first thermally conductive via and the second buried thermally conductive layer contacts the second thermally conductive via, and wherein the first and second buried thermally conductive features are electrically insulated from one another by the substrate and are configured to couple heat from the thermally conductive pad laterally through the electrically insulating substrate between the first buried thermally conductive feature and the second buried thermally conductive feature.

10. The submount of claim 1, further comprising a buried thermally conductive feature in the substrate, wherein the buried thermally conductive feature comprises a thermally conductive layer that extends parallel to the second surface of the substrate.

11. The submount of claim 10, wherein the buried electrically conductive feature contacts the first thermally conductive via.

12. The submount of claim 1, wherein the substrate has a thickness of about 0.3 to 3 mm, and wherein the first thermally conductive via has a length of about 0.1 to 2 mm and an aspect ratio of about 1 to about 10.

13. The submount of claim 1, wherein the first thermally conductive via has a length of about ⅓ to about ⅘ the thickness of the substrate.

14. The submount of claim 1, wherein the first thermally conductive via has a rectangular profile and has a width of at least about 0.05 mm to about 1 mm.

* * * * *

UNITED STATES PATENT AND TRADEMARK OFFICE
CERTIFICATE OF CORRECTION

PATENT NO.        : 8,410,371 B2                                    Page 1 of 1
APPLICATION NO.   : 12/555218
DATED             : April 2, 2013
INVENTOR(S)       : Andrews et al.

It is certified that error appears in the above-identified patent and that said Letters Patent is hereby corrected as shown below:

In the Claims:
Column 13, Claim 1, Line 40: Please correct "an a first electrically"
　　　　　　　　　　　　　　　　　　to read -- a first electrically --

Signed and Sealed this
Twenty-sixth Day of July, 2016

Michelle K. Lee
*Director of the United States Patent and Trademark Office*